United States Patent
Crotzer et al.

(10) Patent No.: US 6,180,221 B1
(45) Date of Patent: *Jan. 30, 2001

(54) CONDUCTIVE ELASTOMER FOR GRAFTING TO THERMOPLASTIC AND THERMOSET SUBSTRATES

(75) Inventors: David R. Crotzer, Nashua, NH (US); Mark G. Hanrahan, Little Common, MA (US); Neill N. Silva, Greenville, RI (US)

(73) Assignee: Thomas & Betts International, Inc., Sparks, NV (US)

( * ) Notice: Under 35 U.S.C. 154(b), the term of this patent shall be extended for 0 days.

This patent is subject to a terminal disclaimer.

(21) Appl. No.: 08/931,130

(22) Filed: Sep. 16, 1997

Related U.S. Application Data

(63) Continuation-in-part of application No. 08/736,830, filed on Oct. 28, 1996, now Pat. No. 5,949,029.

(51) Int. Cl.$^7$ ........................................................ B32B 5/22
(52) U.S. Cl. ........................................ 428/317.9; 428/308.4; 428/316.6; 428/319.1; 428/320.2; 521/92; 521/123
(58) Field of Search ........................... 428/320.2, 308.4, 428/316.6, 319.1, 317.9; 521/92, 123

(56) References Cited

U.S. PATENT DOCUMENTS

| | | | |
|---|---|---|---|
| 3,971,610 | 7/1976 | Buchoff et al. | 339/17 |
| 4,145,317 * | 3/1979 | Sado et al. | 252/512 |
| 4,231,901 * | 11/1980 | Berbeco | 252/511 |
| 4,301,040 * | 11/1981 | Berbeco | 252/511 |
| 4,731,282 * | 3/1988 | Tsukagoshi et al. | 428/220 |
| 4,853,277 | 8/1989 | Chant | 428/209 |
| 5,306,558 | 4/1994 | Takahashi et al. | 428/331 |
| 5,431,571 * | 7/1995 | Hanrahan et al. | 439/91 |

* cited by examiner

Primary Examiner—Cathy F. Lam
(74) Attorney, Agent, or Firm—Weingarten, Schurgin, Gagnebin & Hayes LLP

(57) ABSTRACT

An electrically conductive elastomer for grafting to thermoplastic and thermoset substrates is disclosed. If the substrate is a thermoset substrate, the electrically conductive elastomer comprises a mixture of an elastic material, a quantity of electrically conductive flakes, a thermoplastic elastomer material, and a thermoset material. If the substrate is a thermoplastic substrate, the electrically conductive elastomer comprises a mixture of an elastic material, a quantity of electrically conductive flakes, a thermoplastic elastomer material, and a thermoplastic material. The electrically conductive elastomer may further comprise a quantity of electrically conductive particles interspersed within the mixture. Alternatively, a quantity of electrically conductive particles may be imbedded in an outer surface of the electrically conductive elastomer. The electrically conductive elastomer is typically grafted to the substrate by a thermal process.

44 Claims, 3 Drawing Sheets

CONDUCTIVE ELASTOMER FOR GRAFTING TO THERMOPLASTIC AND THERMOSET SUBSTRATES

CROSS-REFERENCE TO RELATED APPLICATIONS

This patent application is a continuation-in-part patent application of U.S. patent application Ser. No. 08/736,830 filed Oct. 28, 1996, now U.S. Pat. No. 5,949,029.

FIELD OF INVENTION

The present invention relates generally to electrically conductive devices and, more particularly, to an electrically conductive elastomer for grafting to thermoplastic and thermoset substrates.

BACKGROUND OF THE INVENTION

The electronic circuitry for most present day electronic products is typically provided on circuit boards. Most circuit boards are fabricated of thermoset materials such as, for example, FR4™, which contains epoxy and glass fibers. It is because of these constituent elements that thermoset materials have rigid properties. Such rigid properties are required for many applications wherein electronic circuitry is utilized.

A circuit board typically has electrically conductive traces formed thereon for making electrical connections between electronic devices mounted on the circuit board. These electrically conductive traces are typically formed by an etching process wherein a copper alloy material is applied to a surface of the circuit board, and then portions of the copper alloy material is etched away, thereby leaving the remaining copper alloy material to act as the electrically conductive traces. This etching process is typically time and labor intensive. Also, the electrically conductive traces often break when the circuit board is flexed or becomes warped due to changing thermal and/or moisture conditions. Thus, it would be beneficial to provide a material which may be used to form electrically conductive traces on a circuit board that is easily applied and can flexibly withstand most environmental conditions.

Electronic circuitry can also be provided on flex film circuits. Such flex film circuits are typically fabricated of thermoplastic materials such as, for example, KAPTON™, which contains resin fibers. These resin fibers give the flex film circuits their flexible qualities.

A flex film circuit is typically fabricated by laminating at least one electrically conductive copper alloy trace between two sheets of a thermoplastic film such as, for example, KAPTON™. An adhesive is often used to insure that the two sheets of the film remain secured together. This lamination process involves several steps and requires precise alignment of the sheets of thermoplastic film and the electrically conductive copper alloy traces as there are typically openings in the sheets of thermoplastic film to allow access to the electrically conductive copper alloy traces. Also, it is often the case that the electrically conductive traces will fracture after repeated flexing of the flex film circuit. Thus, it would be beneficial to provide a material which may be used to form electrically conductive traces on a flex film circuit that is easily applied and can withstand repeated flexing of the flex film circuit.

SUMMARY OF THE INVENTION

The present invention contemplates an electrically conductive elastomer for grafting to thermoplastic and thermoset substrates. If the substrate is a thermoset substrate, the electrically conductive elastomer comprises a mixture of an elastic material, a quantity of electrically conductive flakes, a thermoplastic elastomer material, and a thermoset material. If the substrate is a thermoplastic substrate, the electrically conductive elastomer comprises a mixture of an elastic material, a quantity of electrically conductive flakes, a thermoplastic elastomer material, and a thermoplastic material. The electrically conductive elastomer may further comprise a quantity of electrically conductive particles interspersed within the mixture. Alternatively, a quantity of electrically conductive particles may be imbedded in an outer surface of the electrically conductive elastomer. The electrically conductive elastomer is typically grafted to the substrate by a thermal process.

In one application, the electrically conductive elastomer is grafted to an thermoset circuit board to form electrically conductive contact pads and circuit traces. In another application, the electrically conductive elastomer is grafted to a thermoplastic flex film to form electrically conductive contact pads and circuit traces.

In view of the foregoing, it is readily apparent that the primary object of the present invention is to provide an electrically conductive elastomer for grafting to thermoplastic and thermoset substrates.

The above-stated primary object, as well as other objects, features, and advantages, of the present invention will become more readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 1:
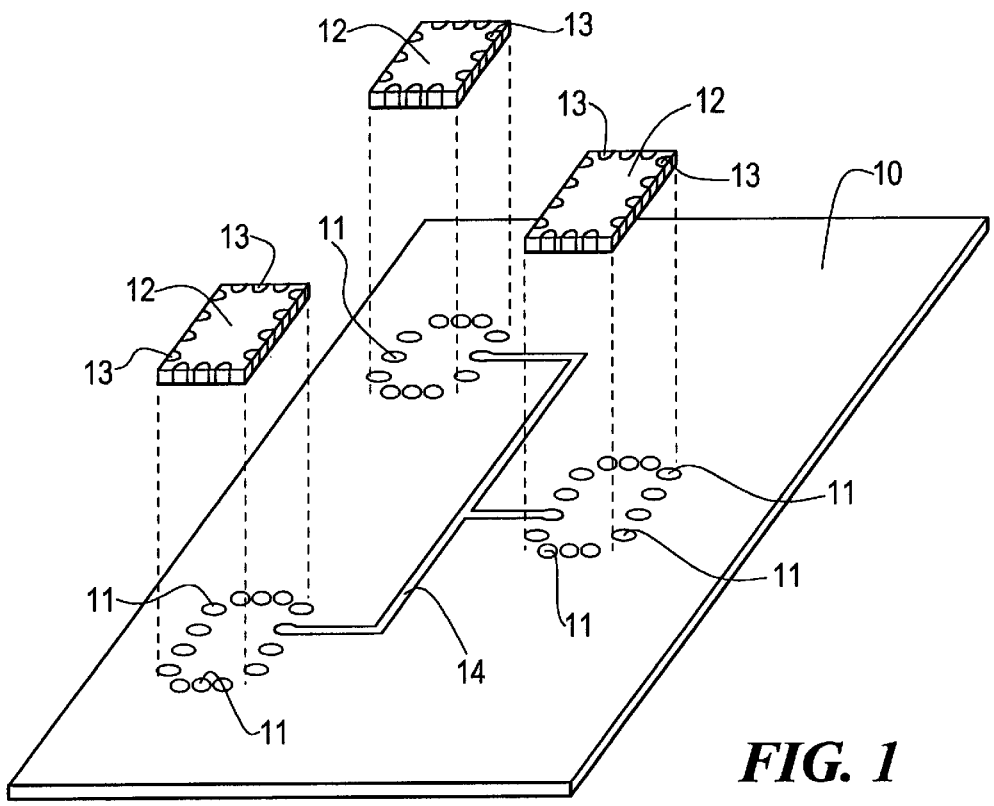
FIG. 1 is a perspective view of a circuit board having a plurality of electrically conductive contact pads and electrically conductive traces formed thereon with an electrically conductive elastomer material in accordance with the present invention.

Referring to FIG. 1, there is shown a perspective view of a circuit board 10 having a plurality of electrically conductive contact pads 11 for making electrical connections with terminals 13 on several corresponding surface mount integrated circuit components 12. The electrically conductive contact pads 11 are electrically interconnected with electrically conductive traces 14 (only one shown for illustrative purposes). The electrically conductive contact pads 11 and the electrically conductive traces 14 are formed with an electrically conductive elastomer material which is grafted directly to the circuit board 10.

The circuit board 10 may be fabricated of one of many different types of thermoset materials such as, for example, FR4™. The electrically conductive elastomer material is grafted directly to the thermoset material of the circuit board 10 so as to form the electrically conductive contact pads 11 and the electrically conductive traces 14. Electrical connections between the electrically conductive contact pads 11 and the terminals 13 on the surface mount integrated circuit components 12 may be made by simply by forcing the terminals 13 on the surface mount integrated circuit components 12 against the electrically conductive contact pads 11. The electrically conductive traces 14 provide electrical interconnections between the electrically conductive contact pads 11, and hence between the surface mount integrated circuit components 12.

The electrically conductive elastomer material comprises a mixture of an elastic material, a quantity of electrically conductive flakes, a thermoplastic elastomer material, and a thermoset material. The elastic material may be any one of a variety of elastic materials such as, for example, silicone rubber or fluorosilicone rubber. The conductive flakes may be fabricated of many different types of conductive or semiconductive materials such as, for example, silver, nickel, or carbon. Alternatively, the conductive flakes may be fabricated of many different types of conductive, semiconductive, or insulative materials which are coated with or have interspersed therein other conductive or semiconductive materials such as, for example, silver, nickel, or carbon. The size of the conductive flakes may vary depending on the level of conductivity that is required and the size of the electrically conductive contact pads 11 and the electrically conductive traces 14.

The thermoplastic elastomer material may be any one of a variety of thermoplastic elastomers such as, for example, VITON™. The thermoplastic elastomer material provides a bridging function between the elastic material and the thermoset material in the electrically conductive elastomer material. That is, as described in more detail below, polymer chains in the thermoplastic elastomer material are grafted to polymer chains in the elastic material and the thermoset material when electrically conductive elastomer material is grafted to the circuit board 10.

Assuming that the circuit board 10 is fabricated of the thermoset material FR4™, which comprises epoxy and glass fibers, the thermoset material is also FR4™. This relationship between the type of thermoset material in the electrically conductive elastomer material and the material type of the circuit board 10 insures that a strong chemical bond will form between the electrically conductive elastomer material and the circuit board 10 when the electrically conductive elastomer material is grafted to the circuit board 10. That is, as described in more detail below, polymer chains in the thermoset material of the electrically conductive elastomer material are grafted to polymer chains in the thermoset material of the circuit board 10 when the electrically conductive elastomer material is grafted to the circuit board 10.

The electrically conductive elastomer material is grafted to the circuit board 10 by a thermal grafting process which typically begins by providing the circuit board 10 in a fully cured state. The electrically conductive elastomer material is deposited on the circuit board 10 in an uncured state by spray coating, roller coating, transfer pad printing, or any of a variety of other known methods. The circuit board 10 and the electrically conductive elastomer material are then subjected to a thermal cycle whereby the electrically conductive elastomer material is fully cured and grafted to the circuit board 10. During this thermal grafting process, polymer chains in the electrically conductive elastomer material are grafted to polymer chains in the circuit board 10 so as to form a strong chemical bond between the electrically conductive elastomer material and the circuit board 10. In the uncured state, the elastic material, the conductive flakes, the thermoplastic elastomer material, and the thermoset material are typically suspended in a solvent, for example, TOLUENE™, which evaporates during the thermal cycle. It should be noted that the grafting process may alternatively involve irradiation or compressive bonding to fully cure and graft the electrically conductive elastomer material to the circuit board 10.

The conductive flakes in the electrically conductive elastomer material provide low resistivity even when the electrically conductive elastomer material is being deformed through expansion or compression since the surface area of the conductive flakes is large enough for electrical contact to be made between adjacent conductive flakes when such deformities occur. For instance, during lengthwise expansion of the electrically conductive elastomer material, the length of the electrically conductive elastomer material is increased while the thickness of the electrically conductive elastomer material is decreased. The decrease in thickness brings adjacent conductive flakes closer together, thereby increasing the likelihood that the large surface areas of adjacent conductive flakes will come into physical, and hence electrical, contact with each other. The increase in length results in lateral movement of the conductive flakes, thereby causing the large surface areas of adjacent conductive flakes to rub or scrape against each other so that physical, and hence electrical, contact between adjacent conductive flakes is maintained.

The durometer rating of the electrically conductive elastomer material typically ranges between 40 and 80 on the Shore A scale. Such a durometer rating allows the electrically conductive elastomer material to be expanded or compressed to at least 33% of its at-rest shape. When such a deformation occurs, the conductive flakes interspersed in the electrically conductive elastomer material interact as described above so as to maintain a low resistivity throughout the electrically conductive elastomer material. An electrically conductive elastomer material that has been grafted to a circuit board in accordance with the present invention has been shown to maintain a resistance in the range of 20–30 mohms during measurements performed while deforming the electrically conductive elastomer material within the above-described limits.

At this point it should be noted that although the circuit board 10 has been shown above with corresponding leadless surface mount integrated circuit components 12, it is also possible to utilize the present invention in an environment where discrete or otherwise leaded components are used. Furthermore, although only a single layered circuit board 10 has been shown above, it is also possible to utilize the present invention on multilayer circuit boards.

Figure 2:
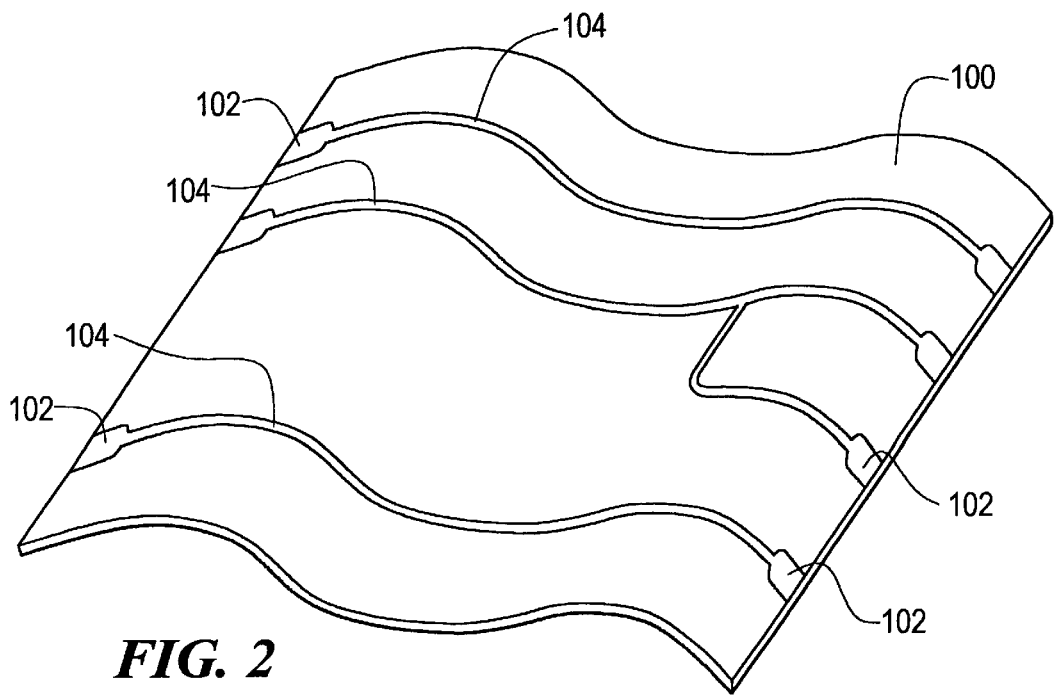
FIG. 2 is a perspective view of a flex film having a plurality of electrically conductive contact pads and a plurality of electrically conductive traces formed thereon with an electrically conductive elastomer material in accordance with the present invention.

In an alternative embodiment, the above-described electrically conductive elastomer material could be used in conjunction with a flex film circuit. Referring to FIG. 2, there is shown a perspective view of a flex film 100 having a plurality of electrically conductive contact pads 102 and a plurality of electrically conductive traces 104 formed thereon. The electrically conductive traces 104 provide electrical interconnections between the electrically conductive contact pads 102. The electrically conductive contact pads 102 and the electrically conductive traces 104 are formed with an electrically conductive elastomer material which is grafted directly to the flex film 100.

The flex film 100 may be fabricated of one of many different types of thermoplastic materials such as, for example, KAPTON™. The electrically conductive elastomer material is grafted directly to the thermoplastic material of the flex film 100 so as to form the electrically conductive contact pads 102 and the electrically conductive traces 104.

The electrically conductive elastomer material comprises a mixture of an elastic material, a quantity of electrically conductive flakes, a thermoplastic elastomer material, and a thermoplastic material. The elastic material may be any one of a variety of elastic materials such as, for example, silicone rubber or fluorosilicone rubber. The conductive flakes may be fabricated of many different types of conductive or semiconductive materials such as, for example, silver, nickel, or carbon. Alternatively, the conductive flakes may be fabricated of many different types of conductive, semiconductive, or insulative materials which are coated with or have interspersed therein other conductive or semiconductive materials such as, for example, silver, nickel, or carbon. The size of the conductive flakes may vary depending on the level of conductivity that is required and the size of the electrically conductive contact pads 102 and the electrically conductive traces 104.

The thermoplastic elastomer material may be any one of a variety of thermoplastic elastomers such as, for example, VITON™. The thermoplastic elastomer material provides a bridging function between the elastic material and the thermoplastic material in the electrically conductive elastomer material. That is, as described in more detail below, polymer chains in the thermoplastic elastomer material are grafted to polymer chains in the elastic material and the thermoplastic material when electrically conductive elastomer material is grafted to the flex film 100.

Assuming that the flex film 100 is fabricated of the thermoplastic material KAPTON™, which comprises resin fibers, the thermoplastic material in the electrically conductive elastomer material is also KAPTON™. This relationship between the type of thermoplastic material in the electrically conductive elastomer material and the material type of the flex film 100 insures that a strong chemical bond will form between the electrically conductive elastomer material and the flex film 100 when the electrically conductive elastomer material is grafted to the flex film 100. That is, as described in more detail below, polymer chains in the thermoplastic material of the electrically conductive elastomer material are grafted to polymer chains in the thermoplastic material of the flex film 100 when the electrically conductive elastomer material is grafted to the flex film 100.

The electrically conductive elastomer material is grafted to the flex film 100 by a thermal grafting process which typically begins by providing the flex film 100 in a fully cured state. The electrically conductive elastomer material is deposited on the flex film 100 in an uncured state by spray coating, roller coating, transfer pad printing, or any of a variety of other known methods. The flex film 100 and the electrically conductive elastomer material are then subjected to a thermal cycle whereby the electrically conductive elastomer material is fully cured and grafted to the flex film 100. During this thermal grafting process, polymer chains in the electrically conductive elastomer material are grafted to polymer chains in the flex film 100 so as to form a strong chemical bond between the electrically conductive elastomer material and the flex film 100. In the uncured state, the elastic material, the conductive flakes, the thermoplastic elastomer material, and the thermoplastic material in the electrically conductive elastomer material are typically suspended in a solvent, for example, TOLUENE™, which evaporates during the thermal cycle. It should be noted that the grafting process may alternatively involve irradiation or compressive bonding to fully cure and graft the electrically conductive elastomer material to the flex film 100.

As described above, the conductive flakes in the electrically conductive elastomer material provide low resistivity even when the electrically conductive elastomer material is being deformed through expansion or compression since the surface area of the conductive flakes is large enough for electrical contact to be made between adjacent conductive flakes when such deformities occur. For instance, during lengthwise expansion of the electrically conductive elastomer material, the length of the electrically conductive elastomer material is increased while the thickness of the electrically conductive elastomer material is decreased. The decrease in thickness brings adjacent conductive flakes closer together, thereby increasing the likelihood that the large surface areas of adjacent conductive flakes will come into physical, and hence electrical, contact with each other. The increase in length results in lateral movement of the conductive flakes, thereby causing the large surface areas of adjacent conductive flakes to rub or scrape against each other so that physical, and hence electrical, contact between adjacent conductive flakes is maintained.

The durometer rating of the electrically conductive elastomer material typically ranges between 40 and 80 on the Shore A scale. Such a durometer rating allows the electrically conductive elastomer material to be expanded or compressed to at least 33% of its at-rest shape. When such a deformation occurs, the conductive flakes interspersed in the electrically conductive elastomer material interact as described above so as to maintain a low resistivity throughout the electrically conductive elastomer material. An electrically conductive elastomer material that has been grafted to a circuit board in accordance with the present invention has been shown to maintain a resistance in the range of 20–30 mohms during measurements performed while deforming the electrically conductive elastomer material within the above-described limits.

Electrical connections may be made with the electrically conductive contact pads 102 and/or the electrically conductive traces 104 by simply by forcing an electrically conductive surface such as, for example, a test probe, against the electrically conductive contact pads 102 and/or the electrically conductive traces 104. The electrically conductive elastomer material will deform under pressure applied by such an electrically conductive surface, and will return to its original shape when pressure is removed.

At this point it should be noted that for both of the electrically conductive elastomer materials described above, it is possible to add further materials to the electrically conductive elastomer material mixture which allow more intimate electrical connections to be made between the electrically conductive elastomer material and any mating electrically conductive surface.

Figure 3:
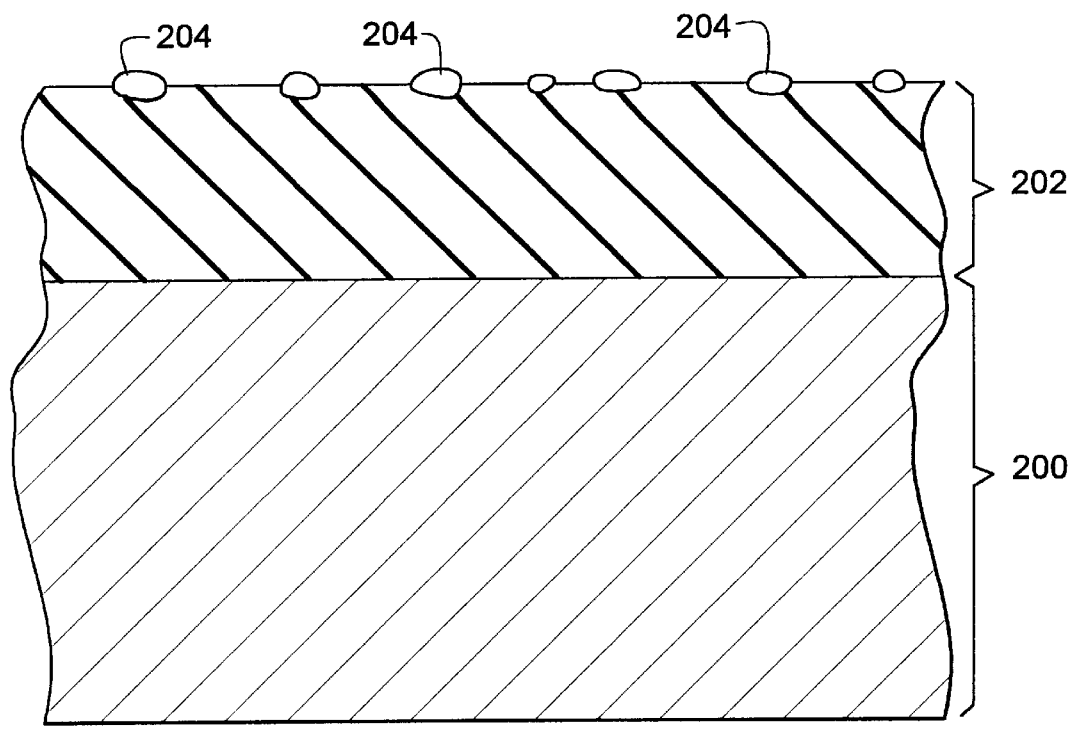
FIG. 3 is a cross-sectional view of a thermoset or a thermoplastic substrate having an electrically conductive elastomer material with imbedded conductive indenting particles grafted thereto in accordance with the present invention.

Referring to FIG. 3, there is shown a cross-sectional view of either a thermoset or a thermoplastic substrate 200 having an electrically conductive elastomer material 202 grafted thereto. If the substrate 200 is a thermoset substrate, the electrically conductive elastomer material 202 comprises a mixture of an elastic material, a quantity of electrically conductive flakes, a thermoplastic elastomer material, and a thermoset material. If the substrate 200 is a thermoplastic substrate, the electrically conductive elastomer material 202 comprises a mixture of an elastic material, a quantity of electrically conductive flakes, a thermoplastic elastomer material, and a thermoplastic material.

Given that the substrate 200 is either a thermoset or a thermoplastic substrate, the electrically conductive elastomer material 202 may further comprise a quantity of electrically conductive indenting particles 204 that are imbedded into the surface of the electrically conductive elastomer material 202. The conductive indenting particles 204 are preferably applied to the surface of the electrically conductive elastomer material 202 prior to a thermal cycle so that the particles 204 are secured to the electrically conductive elastomer material 202 when it fully cures. The indenting nature of the conductive indenting particles 204 provides a means by which an insulating oxide which may have formed on an electrically conductive surface which is to come into contact with the electrically conductive elastomer material 202 may be pushed aside so that an improved electrical connection may be formed between that electrically conductive surface and the electrically conductive elastomer material 202. It should be noted that the conductive indenting particles 204 may push aside other contaminants such as fibers and particulates which may be present on a mating conductive surface.

The conductive indenting particles 204 may be fabricated of many different types of conductive or semiconductive materials such as, for example, silver, nickel, or carbon. Alternatively, the conductive indenting particles 204 may be fabricated of many different types of conductive, semiconductive, or insulative materials which are coated with or have interspersed therein other conductive or semiconductive materials such as, for example, silver, nickel, or carbon. The conductive indenting particles 204 typically have a 50 μm average particle size.

Figure 4:
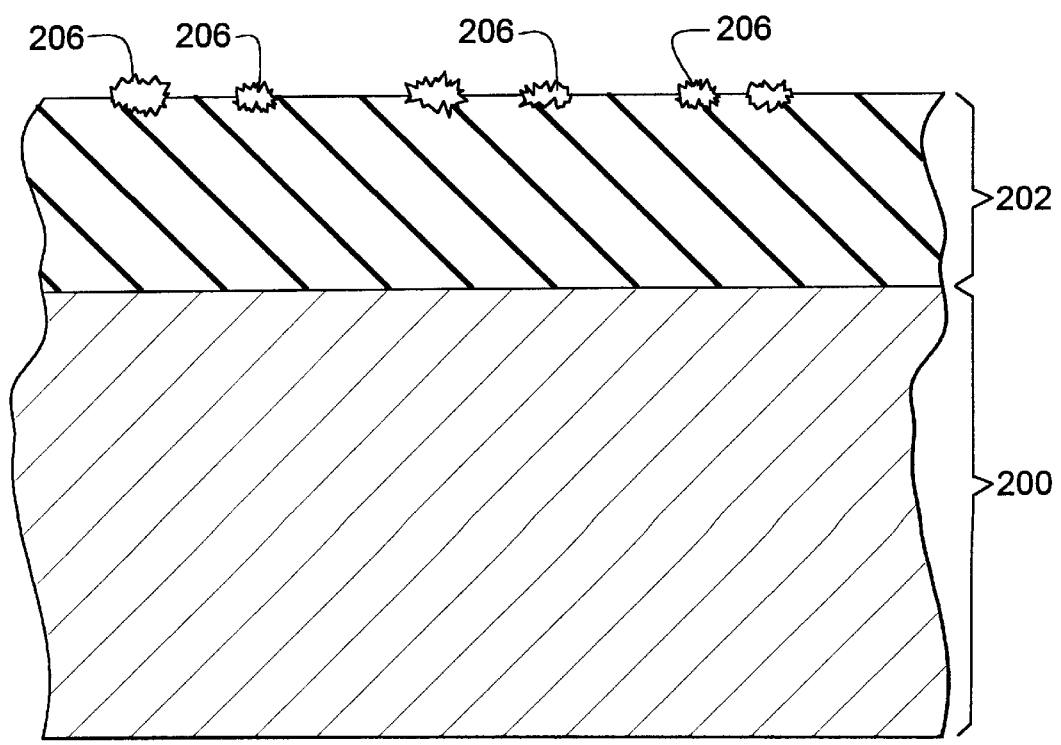
FIG. 4 is a cross-sectional view of a thermoset or a thermoplastic substrate having an electrically conductive elastomer material with imbedded conductive piercing particles grafted thereto in accordance with the present invention.

Referring to FIG. 4, there is shown a cross-sectional view of either the thermoset or the thermoplastic substrate 200 having the electrically conductive elastomer material 202 grafted thereto. Given that the substrate 200 is either a thermoset or a thermoplastic substrate, the electrically conductive elastomer material 202 may further comprise a quantity of electrically conductive piercing particles 206 that are imbedded into the surface of the electrically conductive elastomer material 202. The conductive piercing particles 206 are preferably applied to the surface of the electrically conductive elastomer material 202 prior to a thermal cycle so that the particles 206 are secured to the electrically conductive elastomer material 202 when it fully cures. The piercing nature of the conductive piercing particles 206 provides a means by which an insulating oxide which may have formed on an electrically conductive surface which is to come into contact with the electrically conductive elastomer material 202 may be pierced so that an improved electrical connection may be formed between that electrically conductive surface and the electrically conductive elastomer material 202. It should be noted that the conductive piercing particles 206 may pierce other contaminants such as fibers and particulates which may be present on a mating conductive surface.

The conductive piercing particles 206 may be fabricated of many different types of conductive or semiconductive materials such as, for example, silver, nickel, or carbon. Alternatively, the conductive piercing particles 206 may be fabricated of many different types of conductive, semiconductive, or insulative materials which are coated with or have interspersed therein other conductive or semiconductive materials such as, for example, silver, nickel, or carbon. The conductive piercing particles 206 typically have a 40 μm average particle size.

Figure 5:
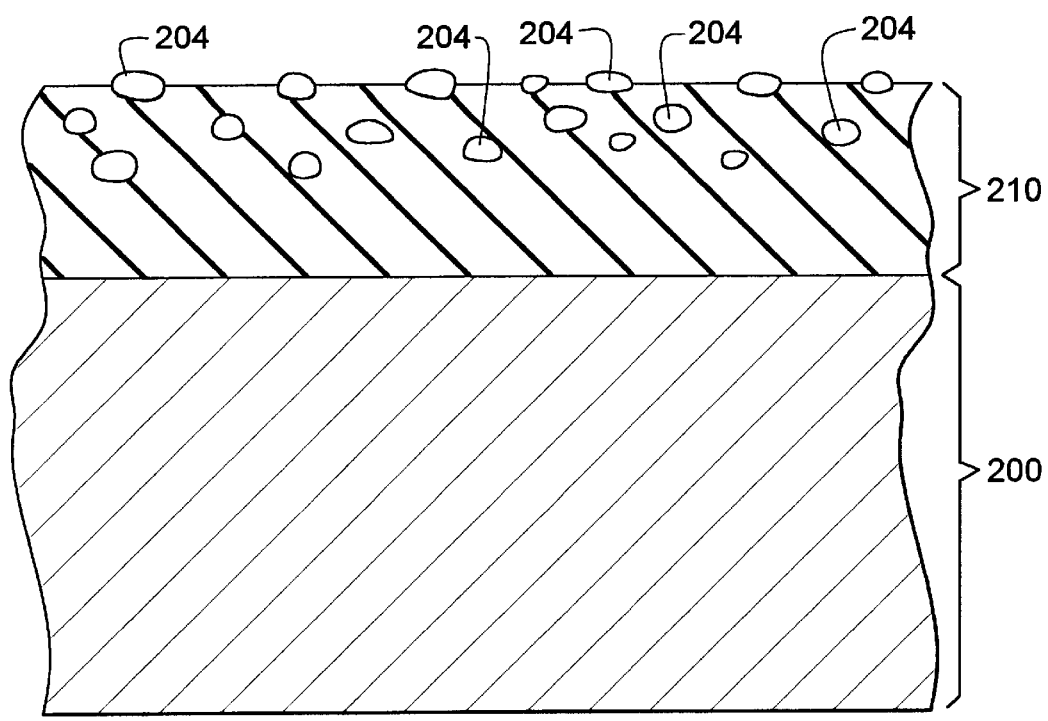
FIG. 5 is a cross-sectional view of a thermoset or a thermoplastic substrate having an electrically conductive elastomer material with conductive indenting particles grafted thereto in accordance with the present invention.

Referring to FIG. 5, there is shown a cross-sectional view of either the thermoset or the thermoplastic substrate 200 having an electrically conductive elastomer material 210 grafted thereto. If the substrate 200 is a thermoset substrate, the electrically conductive elastomer material 210 comprises a mixture of an elastic material, a quantity of electrically conductive flakes, a thermoplastic elastomer material, a thermoset material, and a quantity of the electrically conductive indenting particles 204 (only the indenting particles are shown for purposes of figure clarity). That is, the conductive indenting particles 204 are deposited on the substrate 200 along with the rest of the materials in the electrically conductive elastomer material 210. If the substrate 200 is a thermoplastic substrate, the electrically conductive elastomer material 210 comprises a mixture of an elastic material, a quantity of electrically conductive flakes, a thermoplastic elastomer material, a thermoplastic material, and a quantity of the electrically conductive indenting particles 204 (only the indenting particles are shown for purposes of figure clarity). That is, the conductive indenting particles 204 are deposited on the substrate 200 along with the rest of the materials in the electrically conductive elastomer material 210.

The distribution of the conductive indenting particles 204 in the electrically conductive elastomer material 210 is shown to be near the surface of the electrically conductive elastomer material 210 since the conductive indenting particles 204 are likely to bounce off the substrate 200 during the application of the electrically conductive elastomer material 210. That is, when the electrically conductive elastomer material 210 is applied to the substrate 200 by spray coating, the conductive indenting particles 204 are likely to bounce off the substrate 200. Of course, this location for the conductive indenting particles 204 is preferable based on their functionality (e.g., to push aside oxide on a mating conductive surface). The amount of the conductive indenting particles 204 in the electrically conductive elastomer material 210 need typically only be 5% nominal by weight in order to insure their proper functionality.

Figure 6:
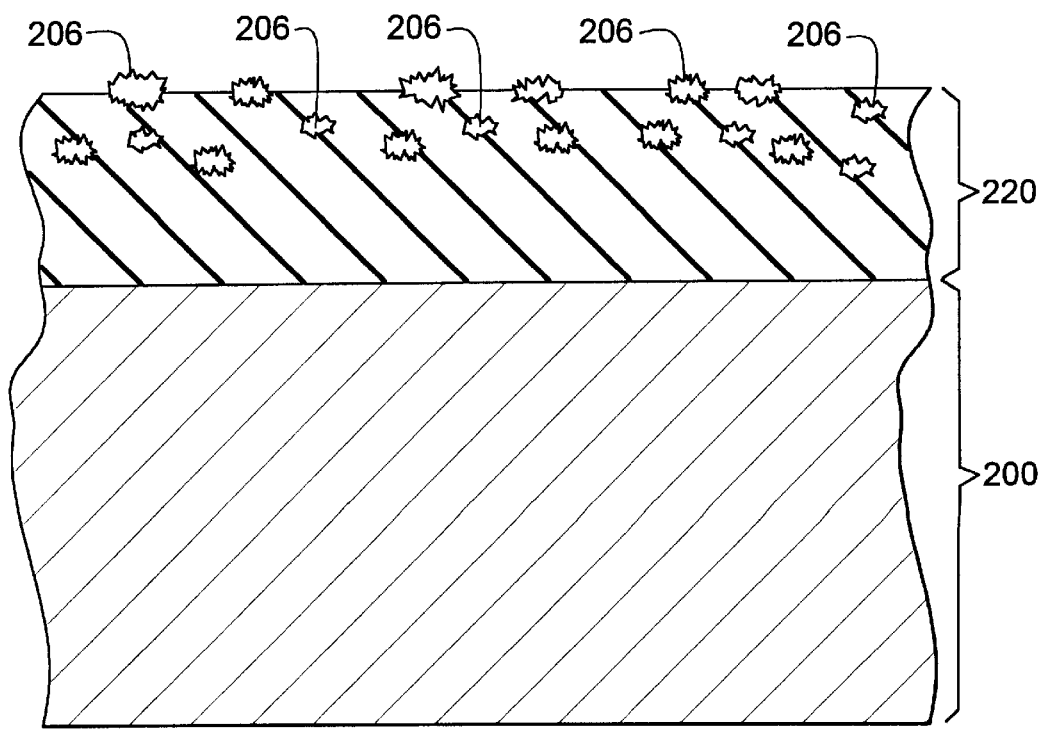
FIG. 6 is a cross-sectional view of a thermoset or a thermoplastic substrate having an electrically conductive elastomer material with conductive piercing particles grafted thereto in accordance with the present invention.

Referring to FIG. 6, there is shown a cross-sectional view of either the thermoset or the thermoplastic substrate 200 having an electrically conductive elastomer material 220 grafted thereto. If the substrate 200 is a thermoset substrate, the electrically conductive elastomer material 220 comprises a mixture of an elastic material, a quantity of electrically conductive flakes, a thermoplastic elastomer material, a thermoset material, and a quantity of the electrically conductive piercing particles 206 (only the piercing particles are shown for purposes of figure clarity). That is, the conductive piercing particles 206 are deposited on the substrate 200 along with the rest of the materials in the electrically conductive elastomer material 220. If the substrate 200 is a thermoplastic substrate, the electrically conductive elastomer material 220 comprises a mixture of an elastic material, a quantity of electrically conductive flakes, a thermoplastic elastomer material, a thermoplastic material, and a quantity of the electrically conductive piercing particles 206 (only the piercing particles are shown for purposes of figure clarity). That is, the conductive piercing particles 206 are deposited on the substrate 200 along with the rest of the materials in the electrically conductive elastomer material 220.

The distribution of the conductive piercing particles 206 in the electrically conductive elastomer material 220 is shown to be near the surface of the electrically conductive elastomer material 220 since the conductive piercing particles 206 are likely to bounce off the substrate 200 during the application of the electrically conductive elastomer material 220. That is, when the electrically conductive elastomer material 220 is applied to the substrate 200 by spray coating, the conductive piercing particles 206 are likely to bounce off the substrate 200. Of course, this location for the conductive piercing particles 206 is preferable based on their functionality (e.g., to pierce oxide on a mating conductive surface). The amount of the conductive piercing particles 206 in the electrically conductive elastomer material 220 need typically only be 5% nominal by weight in order to insure their proper functionality.

At this point it should be noted that any of the above-described electrically conductive elastomer materials, including those with electrically conductive piercing and indenting particles, may be utilized for any number of applications wherein an electrically conductive surface, trace, coating, or other electrically conductive element having elastic properties is required. For example, an electrically conductive elastomer material may be grafted to a thermoset or a thermoplastic substrate for purposes of forming a conductive plane for shielding or grounding purposes or the like. The density and grouping of the conductive flakes in the above-described electrically conductive elastomer materials are such that extremely effective shielding or grounding layers may be provided.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A circuit board comprising:
a substrate, said substrate having an outer surface, said substrate being formed of a non-conductive thermoset material; and
a conductive elastomer thermally grafted directly to at least a portion of said outer surface of said substrate, said conductive elastomer being formed of a mixture of a non-conductive elastic material, a quantity of conductive flakes interspersed in said elastomer to provide continuous electrical communication through contact between adjacent flakes throughout deformation of the said elastomer, a thermoplastic elastomer material, and a thermoset material.

2. The circuit board as defined in claim 1, wherein the grafting of said conductive elastomer to said substrate is performed by irradiation.

3. The circuit board as defined in claim 1, wherein the grafting of said conductive elastomer to said substrate is performed by compression.

4. The circuit board as defined in claim 1, wherein said conductive flakes are formed of a solid conductive material.

5. The circuit board as defined in claim 1, wherein said conductive flakes are formed of a semi-conductive material that is coated with a conductive material.

6. The circuit board as defined in claim 1, wherein said conductive flakes are formed of a non-conductive material that is coated with a conductive material.

7. The circuit board as defined in claim 1, wherein said conductive elastomer has an outer surface, and wherein at least some of said conductive particles are present along said outer surface of said conductive elastomer.

8. The circuit board as defined in claim 7, wherein said conductive particles have a rounded outer surface so as to push aside any oxide or other contaminants which may have formed on a mating conductive surface when said circuit board is coupled to the mating conductive surface.

9. The circuit board as defined in claim 8, wherein said rounded conductive particles typically have a 50 $\mu$m average particle size.

10. The circuit board as defined in claim 7, wherein said conductive particles have a jagged outer surface so as to pierce through any oxide or other contaminants which may have formed on a mating conductive surface when said circuit board is coupled to the mating conductive surface.

11. The circuit board as defined in claim 10, wherein said jagged conductive particles typically have a 40 $\mu$m average particle size.

12. The circuit board as defined in claim 7, wherein said conductive particles are formed of a solid conductive material.

13. The circuit board as defined in claim 7, wherein said conductive particles are formed of a semi-conductive material that is coated with a conductive material.

14. The circuit board as defined in claim 7, wherein said conductive particles are formed of a non-conductive material that is coated with a conductive material.

15. The circuit board as defined in claim 1, wherein said conductive elastomer has an outer surface, and wherein a quantity of conductive particles are imbedded in and extend at least partially from said outer surface of said conductive elastomer.

16. The circuit board as defined in claim 15, wherein said conductive particles have a rounded outer surface so as to push aside any oxide or other contaminants which may have formed on a mating conductive surface.

17. The circuit board as defined in claim 16, wherein said rounded conductive particles typically have a 50 $\mu$m average particle size.

18. The circuit board as defined in claim 15, wherein said conductive particles have a jagged outer surface so as to pierce through any oxide or other contaminants which may have formed on a mating conductive surface when said elastic circuit is coupled to the mating conductive surface.

19. The circuit board as defined in claim 18, wherein said jagged conductive particles have a 40 $\mu$m average particle size.

20. The circuit board as defined in claim 15, wherein said conductive particles are formed of a solid conductive material.

21. The circuit board as defined in claim 15, wherein said conductive particles are formed of a semi-conductive material that is coated with a conductive material.

22. The circuit board as defined in claim 15, wherein said conductive particles are formed of a non-conductive material that is coated with a conductive material.

23. A flex film circuit comprising:
a substrate, said substrate having an outer surface, said substrate being formed of a non-conductive thermoplastic material; and
a conductive elastomer thermally grafted directly to at least a portion of said outer surface of said substrate, said conductive elastomer being formed of a mixture of non-conductive elastic material, a quantity of conductive flakes interspersed in said elastomer to provide continuous electrical communication through contact between adjacent flakes throughout deformation of said elastomer, a thermoplastic elastomer material, and a thermoplastic material.

24. The flex film circuit as defined in claim 23, wherein the grafting of said conductive elastomer to said substrate is performed by irradiation.

25. The flex film circuit as defined in claim 23, wherein the grafting of said conductive elastomer to said substrate is performed by compression.

26. The flex film circuit as defined in claim 23, wherein said conductive flakes are formed of a solid conductive material.

27. The flex film circuit as defined in claim 23, wherein said conductive flakes are formed of a semi-conductive material that is coated with a conductive material.

28. The flex film circuit as defined in claim 23, wherein said conductive flakes are formed of a non-conductive material that is coated with a conductive material.

29. The flex film circuit as defined in claim 23, wherein said conductive elastomer has an outer surface, and wherein at least some of said conductive particles are present along said outer surface of said conductive elastomer.

30. The flex film circuit as defined in claim 29, wherein said conductive particles have a rounded outer surface so as to push aside any oxide or other contaminants which may have formed on a mating conductive surface when said flex film circuit is coupled to the mating conductive surface.

31. The flex film circuit as defined in claim 30, wherein said rounded conductive particles have a 50 μm average particle size.

32. The flex film circuit as defined in claim 29, wherein said conductive particles have a jagged outer surface so as to pierce through an oxide or other contaminants which may have formed on a mating conductive surface when said flex film circuit is coupled to the mating conductive surface.

33. The flex film circuit as defined in claim 32, wherein said jagged conductive particles have a 40 μm average particle size.

34. The flex film circuit as defined in claim 29, wherein said conductive particles are formed of a solid conductive material.

35. The flex film circuit as defined in claim 29, wherein said conductive particles are formed of a semi-conductive material that is coated with a conductive material.

36. The flex film circuit as defined in claim 29, wherein said conductive particles are formed of a non-conductive material that is coated with a conductive material.

37. The flex film circuit as defined in claim 23, wherein said conductive elastomer has an outer surface, and wherein a quantity of conductive particles are imbedded in and extend beyond said outer surface of said conductive elastomer.

38. The flex film circuit as defined in claim 37, wherein said conductive particles have a rounded outer surface so as to push aside any oxide or other contaminants which may have formed on a mating conductive surface when said flex film circuit is coupled to the mating conductive surface.

39. The flex film circuit as defined in claim 38, wherein said rounded conductive particles typically have a 50 μm average particle size.

40. The flex film circuit as defined in claim 37, wherein said conductive particles have a jagged outer surface so as to pierce through any oxide or other contaminants which may have formed on a mating conductive surface when said flex film circuit is coupled to the mating conductive surface.

41. The flex film circuit as defined in claim 40, wherein said jagged conductive particles have a 40 μm average particle size.

42. The flex film circuit as defined in claim 37, wherein said conductive particles are formed of a solid conductive material.

43. The flex film circuit as defined in claim 37, wherein said conductive particles are formed of a semi-conductive material that is coated with a conductive material.

44. The flex film circuit as defined in claim 37, wherein said conductive particles are formed of a non-conductive material that is coated with a conductive material.

* * * * *